United States Patent
Noh et al.

(10) Patent No.: US 10,644,265 B2
(45) Date of Patent: May 5, 2020

(54) ORGANIC LIGHT EMITTING DISPLAY DEVICE

(71) Applicant: LG Display Co., Ltd., Seoul (KR)

(72) Inventors: Seonghee Noh, Seoul (KR); YoungNam Lim, Seoul (KR); SangHo Lee, Gyeonggi-do (KR); DaeWon Ryu, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/291,349

(22) Filed: Oct. 12, 2016

(65) Prior Publication Data

US 2017/0373277 A1    Dec. 28, 2017

(30) Foreign Application Priority Data

Jun. 28, 2016    (KR) .......................... 10-2016-0081206

(51) Int. Cl.
*H01L 51/52*    (2006.01)
*H01L 27/32*    (2006.01)
*H01L 51/50*    (2006.01)

(52) U.S. Cl.
CPC ...... *H01L 51/5265* (2013.01); *H01L 27/3244* (2013.01); *H01L 51/5012* (2013.01);
(Continued)

(58) Field of Classification Search
CPC ............. H01L 51/5265; H01L 51/5221; H01L 51/5012; H01L 51/5206; H01L 27/3244; H01L 2251/301; H01L 2251/558
See application file for complete search history.

(56) References Cited

U.S. PATENT DOCUMENTS 5,405,710 A * 4/1995 Dodabalapur ...... H01L 27/3206
                                                                            313/503
5,478,658 A * 12/1995 Dodabalapur ...... H01L 51/5265
                                                                            313/504
(Continued)

FOREIGN PATENT DOCUMENTS

CN    101359723 A    2/2009
CN    102809775 A    12/2012
(Continued)

OTHER PUBLICATIONS

Philipp, H. R. Optical properties of silicon nitride. J. Electrochem. Soc. 120 (1973) 295-300.*
(Continued)

*Primary Examiner* — Thao X Le
*Assistant Examiner* — Gardner W. S. Swan
(74) *Attorney, Agent, or Firm* — Morgan, Lewis & Bockius LLP

(57) ABSTRACT

An organic light emitting display device has an optical multilayer film on an organic light emitting diode. The organic light emitting display device includes an organic light emitting element with a cathode, an anode, and an organic light emitting layer, and an optical multilayer film on the organic light emitting element. The optical multilayer film is constructed such that a full width at half maximum of light emitted from the organic light emitting element is larger than a full width at half maximum of light emitted from a structure in which the optical multilayer film is not used. The color shift depending on a viewing angle of the organic light emitting display device may be reduced to improve efficiency of the organic light emitting element.

17 Claims, 15 Drawing Sheets

(52) U.S. Cl.
CPC ...... *H01L 51/5206* (2013.01); *H01L 51/5221* (2013.01); *H01L 51/5253* (2013.01); *H01L 51/5275* (2013.01); *H01L 2251/301* (2013.01); *H01L 2251/558* (2013.01)

(56) References Cited

U.S. PATENT DOCUMENTS

| | | | |
|---|---|---|---|
| 2005/0037232 A1* | 2/2005 | Tyan | H01L 51/5265 428/690 |
| 2006/0066220 A1* | 3/2006 | Choong | H01L 51/5265 313/501 |
| 2006/0250084 A1 | 11/2006 | Cok et al. | |
| 2010/0051973 A1* | 3/2010 | Kobayashi | H05K 999/00 257/88 |
| 2010/0243999 A1 | 9/2010 | Ishikawa | |
| 2010/0322278 A1* | 12/2010 | Mochizuki | B82Y 20/00 372/45.01 |
| 2011/0042696 A1* | 2/2011 | Smith | H01L 51/5265 257/89 |
| 2011/0100458 A1 | 5/2011 | Kang et al. | |
| 2011/0309739 A1* | 12/2011 | Song | H01L 51/5088 313/504 |
| 2012/0307167 A1 | 12/2012 | Kobayashi et al. | |
| 2013/0032830 A1* | 2/2013 | Lee | G02B 5/3041 257/88 |
| 2016/0072101 A1 | 3/2016 | Choi et al. | |
| 2016/0095172 A1* | 3/2016 | Lee | C23C 16/401 313/504 |
| 2016/0197308 A1* | 7/2016 | Jeong | H01L 51/5275 257/40 |
| 2016/0233453 A1* | 8/2016 | Lee | H01L 51/5256 |
| 2016/0380235 A1* | 12/2016 | Kim | H01L 51/0061 257/40 |

FOREIGN PATENT DOCUMENTS

| | | |
|---|---|---|
| CN | 105247702 A | 1/2016 |
| WO | 2014041743 A1 | 3/2014 |

OTHER PUBLICATIONS

Konig, T. A. F. et al. Electrically tunable plasmonic behavior of nanocube polymer nanomaterials induced by a redox-active electrochromic polymer. ACS Nano. 8 (2014) 6182-6192.*
Malitson, I. H. Interspecimen comparison of the refractive index of fused silica. J. Opt. Soc. Am. 55 (1965) 1205-1209.*
Communication dated Dec. 5, 2017 from the European Patent Office in counterpart European application No. 16191755.4.
The First Office Action dated Oct. 12, 2018, from the State Intellectual Property Office of People's Republic of China in counterpart Chinese application No. 201610875991.7.
The Second Office Action dated Jun. 28, 2019, from the State Intellectual Property Office of People's Republic of China in counterpart Chinese application No. 201610875991.7.
The Third Office Action dated Sep. 30, 2019, from the State Intellectual Property Office of People's Republic of China in counterpart Chinese application No. 201610875991.7.

* cited by examiner

ORGANIC LIGHT EMITTING DISPLAY DEVICE

CROSS-REFERENCE TO RELATED APPLICATIONS

This application claims the priority of Korean Patent Application No. 10-2016-0081206 filed on Jun. 28, 2016 in the Korean Intellectual Property Office, the disclosure of which is incorporated herein by reference in its entirety for all purposes as if fully set forth herein.

BACKGROUND

Technical Field

The present disclosure relates to an organic light emitting display device, and more particularly, to an organic light emitting display device having an optical multilayer film on an organic light emitting element.

Description of the Related Art

An active organic light emitting display device includes an organic light emitting element including an organic light emitting layer, an anode, and a cathode and a driving circuit (for example, a transistor or a capacitor) which drives the organic light emitting element. Specifically, the organic light emitting display device is a display apparatus in which holes and electrons injected from an anode and a cathode are recombined to each other in a light emitting layer to form an exciton and light having a specific wavelength is generated by emitting energy of the exciton. Therefore, the organic light emitting display device uses a self-light emitting organic light emitting element so as to have a high response speed, a high contrast ratio, a high luminous efficiency, a high brightness, and a wide viewing angle.

In this case, optical efficiency of the organic light emitting display device is divided into an internal efficiency and an external efficiency. The internal efficiency depends on photoelectric conversion efficiency of an organic light emitting material. The external efficiency is also referred to as light coupling efficiency and depends on refractive indexes of each layers constituting the organic light emitting element. In this case, the light coupling efficiency of the organic light emitting display device is lower than those of other display devices. This is because when light discharged from the organic light emitting layer is emitted at a critical angle or larger, for example, total reflection is caused at an interface between a layer having a high refractive index such as an electrode formed of indium tin oxide (ITO) which forms an anode or a cathode and a layer having a low refractive index such as an encapsulating layer. Therefore, the light is suppressed from being extracted to the outside. Accordingly, approximately 20% of light substantially emitted from the organic light emitting element in the organic light emitting display device is extracted to the outside.

As described above, the self-emitted light from the organic light emitting device goes out of the organic light emitting display device through various components of the organic light emitting display device. However, some light of light emitted from the organic light emitting layer does not go out from the organic light emitting display device but is locked in the organic light emitting display device. That is, there is an interface having different refractive indexes on an emission surface of the organic light emitting element so that reflection, absorption, scattering, refraction, and the like, are generated, which may lower the light coupling efficiency. Therefore, the light coupling efficiency at a front surface and a side surface of the organic light emitting display device may be considered as a problem.

In order to solve the problem of the light coupling efficiency, a method which varies a thickness and a refractive index of the organic light emitting layers disposed on the organic light emitting element or adds an organic layer to cause strong microcavity effect in the organic light emitting element, thereby increasing efficiency of the light may be used. Here, the strong microcavity refers to a state in which intensity of light is increased by reducing a full width at half maximum of a main peak wavelength. However, when the thickness and the refractive index of the organic light emitting layer vary or an organic layer is added to the organic light emitting layer, the microcavity effect becomes strong so that a color of emitted light changes depending on a viewing angle and the emitted light has straightness. Therefore, the light may not have Lambertian distribution. Therefore, when the strong microcavity is used, front light efficiency and color purity are improved. However, light efficiency at a viewing angle may be reduced and color shift may be significant.

SUMMARY

Accordingly, the present disclosure is directed to an organic light emitting display device that substantially obviates one or more of the problems due to limitations and disadvantages of the related art.

An object of the present disclosure is to provide an organic light emitting display device which forms an optical multilayer film serving as an optical cavity on a light emitting surface of an organic light emitting display device to reduce color shift depending on a viewing angle and improve efficiency of an organic light emitting element.

Another object of the present disclosure is to provide an organic light emitting display device which optimizes a deposition order of optical layers which form an optical multilayer film in accordance with refractive indexes to allow light which is primarily interfered in the organic light emitting element to be incident onto the optical multilayer film to cause secondary interference in the optical multilayer film to generate weak microcavity effect and increase a full width at half maximum (FWHM) of a main peak wavelength of the light. That is, the weak microcavity refers to a state when the FWHM of the main peak wavelength is increased to less affect the property of the viewing angle. Therefore, a structure which generates the weak microcavity effect is applied to reduce the color shift depending on a viewing angle.

Another object of the present disclosure is to provide an organic light emitting display device which optimizes the number and the thickness of optical layers which form the optical multilayer film, to solve a reliability problem of the organic light emitting display device which is in a trade-off relationship with a method for reducing the color shift depending on a viewing angle.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described, an organic light emitting display device comprises an organic light emitting element including a cathode, an anode, and an organic light emitting layer, and an optical multilayer film on the organic light emitting element. Herein, the optical multilayer film is formed such that a full width at half maximum of light emitted from the organic light emitting element is larger than a full width at half maximum of light emitted from a structure in which the optical multilayer film is not used. Therefore, the color shift depending on a viewing angle of the organic light emitting display device may be reduced and efficiency of the organic light emitting element may be improved.

In another aspect, an organic light emitting display device comprises an organic light emitting element including a cathode, an anode, and an organic light emitting layer, and an optical multilayer film on the organic light emitting element. Herein, the optical multilayer film is formed to have a structure which generates weak microcavity effect, thereby reducing the color shift depending on a viewing angle of the organic light emitting display device and improving efficiency of the organic light emitting element.

In another aspect, an organic light emitting display device comprises an organic light emitting element including a cathode, and an optical multilayer film are deposited a first optical layer and a second optical layer in order on the organic light emitting element. A refractive index of the first optical layer is larger than a refractive index of the second optical layer so that the color shift depending on a viewing angle of the organic light emitting display device may be reduced and efficiency of the organic light emitting element may be improved.

Other detailed matters of the embodiments are included in the detailed description and the drawings.

According to the exemplary embodiments of the present disclosure, the optical multilayer film is disposed on the organic light emitting element so that the optical multilayer film is formed such that a full width at half maximum of light emitted from the organic light emitting element is larger than a full width at half maximum of light emitted from a structure in which the optical multilayer film is not used. Therefore, the color shift depending on a viewing angle may be reduced and efficiency of the organic light emitting element may be improved.

According to the exemplary embodiments of the present disclosure, the capping layer is formed to have a thickness of less than 5 nm. Therefore, the color shift depending on a viewing angle is reduced and the optical multilayer film is suppressed from being separated from the organic light emitting element.

Further, according to the exemplary embodiments of the present disclosure, the refractive index of the first optical layer is larger than the refractive index of the cathode and the third optical layer having a refractive index which is larger than that of the second optical layer is disposed on the second optical layer. Therefore, the light which passes through the organic light emitting element causes secondary interference, to reduce the color shift depending on a viewing angle and improve the efficiency of the organic light emitting element.

According to the exemplary embodiments of the present disclosure, a fourth optical layer is additionally formed and the fourth optical layer may be formed to have a thickness which is between 100 nm and 5000 nm. Therefore, the reliability of the organic light emitting element may be maintained without additionally providing a passivation layer on the optical multilayer film.

Therefore, according to the exemplary embodiments of the present disclosure, the optical layers having small refractive indexes among the optical layers which configure the optical multilayer film are formed of silicon oxynitride SiON, to suppress hydrogen $H_2$ from being generated when the optical layer is formed, thereby suppressing the deterioration of the organic light emitting layer.

Further, according to the exemplary embodiments of the present disclosure, the organic layer and the passivation layer are formed on the optical multilayer film to suppress the optical multilayer film from being separated due to particles which are formed on the optical multilayer film and improve the reliability of the organic light emitting device.

Further, according to the exemplary embodiments of the present disclosure, the atomic deposition layer is formed on the optical multilayer film to closely cover the stack of the optical multilayer film, thereby improving the reliability of the organic light emitting element.

Further, according to the exemplary embodiments of the present disclosure, the atomic deposition layer is formed on the capping layer to cover a surface of the capping layer, thereby improving the reliability of the organic light emitting element.

Furthermore, according to the exemplary embodiments of the present disclosure, the difference in refractive indexes of optical layers which form the optical multilayer film is between 0.01 and 0.06. Therefore, the optical layer may be suppressed from being separated due to the difference in expansion coefficients depending on the difference in the refraction indexes of the optical layers during the evaluation of reliability.

Further, according to the exemplary embodiments of the present disclosure, a structure in which the optical multilayer film causes weak microcavity effect is applied to reduce the color shift depending on a viewing angle and improve the efficiency of the organic light emitting element.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
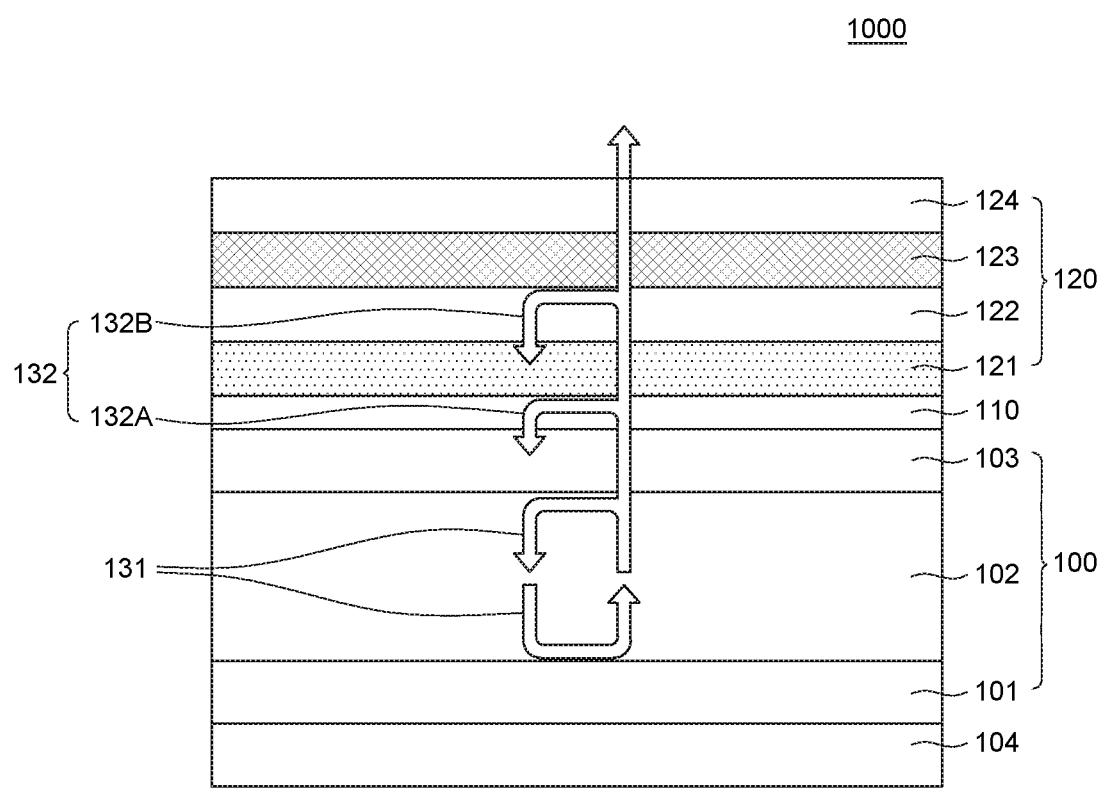
FIG. 1 is a cross-sectional view illustrating an organic light emitting display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When the relation of a time sequential order is described using the terms such as "after", "continuously to", "next to", and "before", the order may not be continuous unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely bonded to or combined with each other and can be interlocked and operated in technically various ways, and the embodiments can be carried out independently of or in association with each other.

Hereinafter, an organic light emitting display device according to an exemplary embodiment of the present disclosure will be described with reference to the accompanying drawings.

FIG. 1 is a cross-sectional view illustrating an organic light emitting display device according to a first exemplary embodiment of the present disclosure.

An organic light emitting display device 1000 includes a substrate 104, an organic light emitting element 100, a capping layer 110, and an optical multilayer film 120 which are disposed on the substrate 104.

A driving circuit which drives the organic light emitting element 100 may be disposed on the substrate 104 and include a transistor and a capacitor. In this case, the driving circuit may be formed corresponding to a plurality of sub pixels formed on the substrate 104 and is connected to an anode 101 of the organic light emitting element 100.

The substrate 104 may be formed of an insulating material. For example, the substrate 104 may be formed of a glass or a flexible film formed of a polyimide, acryl, polyacrylate, polycarbonate, polyether, sulfonic acid based material, silicon oxide (SiOx), or the like, but is not limited thereto.

The organic light emitting element 100 disposed on the substrate 104 includes an anode 101, an organic light emitting layer 102, and a cathode 103. In this case, a hole injecting layer and a hole transporting layer may be included between the organic light emitting layer 102 and the anode 101 and an electron transporting layer and an electron injecting layer may be included between the organic light emitting layer 102 and the cathode 103. However, the present disclosure is not limited thereto. Further, the organic light emitting layer 102 may be a single layer structure having one light emitting layer as a light emitting layer which emits red light, blue light, green light or similar color light. Alternatively, the organic light emitting layer 102 may have a tandem structure in which two or more light emitting layers are provided and a charge generating layer (CGL) is included between the light emitting layers.

The light emitted from the organic light emitting layer 102 causes primary interference between the anode 101 and the cathode 103. Specifically, the organic light emitting element 100 may have a structure and a thickness determined by considering a microcavity distance between the anode 101 and the cathode 103 depending on a wavelength of light emitted from the organic light emitting layer 102. The microcavity refers that light emitted from the light emitting layer is amplified by being repeatedly reflected and re-reflected between the anode 101 and the cathode 103 to cause constructive interference, thereby improving luminous efficiency. In this case, the organic light emitting layer 102 may be formed to be separated in every sub pixel and a distance between the anode 101 and the cathode 103 may vary depending on a color of light emitted from every sub pixel. In the meantime, in the organic light emitting display device using white light, the organic light emitting layer 102 may be commonly formed in a plurality of sub pixels.

As described above, the anode 101 may be disposed to be separated for every sub pixel and is connected to a source electrode or a drain electrode of a transistor which is disposed on the substrate 104, as an electrode which supplies or delivers the hole to the organic light emitting layer 102.

In a top emission type organic light emitting display device 1000, a plurality of anodes 101 may include a reflective layer so that the light emitted from the organic light emitting layer 102 is reflected from the anode 101 to be smoothly discharged to an upward direction (or a direction which passes through the cathode 103). For example, the anode 101 may have a dual layered structure in which a transparent layer and the reflective layer are laminated or a triple layered structure in which a transparent layer, a reflective layer and a transparent layer are laminated. The transparent layer may be formed of a transparent conductive oxide such as indium tin oxide (ITO) or indium zinc oxide (IZO). The reflective layer may be formed of a metal material such as copper (Cu), silver (Ag), palladium (Pd), aluminum (Al), platinum (Pt), gold (Au), chrome (Cr), tungsten (W), molybdenum (Mo), titanium (Ti), or iridium (Ir). Alternatively, the anode 101 may be a single layer configured by a material or a structure having characteristics of a transparent layer and a reflective layer.

The cathode 103 is commonly disposed for a plurality of sub pixels and supplies and delivers the electron to the organic light emitting layer 102.

In the top emission type organic light emitting display device 1000, the cathode 103 may be transparent so that light emitted from the organic light emitting layer 102 passes through the cathode. For example, the cathode 103 may be disposed by forming a metal material such as silver (Ag), magnesium (Mg), or an alloy thoseof to have a very small thickness. Alternatively, the cathode 103 may be formed of a transparent conductive oxide material such as indium tin oxide or indium zinc oxide, similarly to the transparent layer of the anode 101.

The light emitted from the organic light emitting element 100 due to the primary interference 131 has a strong microcavity effect, that is, an effect of improving the luminous efficiency. However, as the intensity of light is increased by the strong microcavity effect, there may be a problem in that a viewing angle characteristic of the organic light emitting display device 1000 is lowered. Here, the strong microcavity refers to a state in which intensity of light is increased by reducing a full width at half maximum of a main peak wavelength. Specifically, according to the strong microcavity effect, as the intensity of the light emitted from the organic light emitting element 100 is increased, the full width at half maximum of a main peak wavelength of light is reduced. Therefore, the front efficiency of the organic light emitting display device 1000 is increased but the viewing angle characteristic is lowered. Therefore, in order to reduce the color shift depending on a viewing angle and increase the efficiency of the organic light emitting element 100 by increasing the full width at half maximum of a main peak wavelength of light while maintaining the intensity of the light of the organic light emitting display device 1000, in the organic light emitting display device 1000 according to the first exemplary embodiment, an optical multilayer film 120 may be provided on a surface onto which light emitted from the organic light emitting element 100 is emitted. The optical multilayer film 120 will be described below and the capping layer 110 will be described now.

The capping layer 110 may be disposed between the organic light emitting element 100 and the optical multilayer film 120. The capping layer 110 covers the organic light emitting element 100 to block inflow of oxygen and moisture entering from the outside and improve the efficiency of the light which passes through the cathode 103. However, when the capping layer 110 is formed to have a large thickness, for example, approximately 40 nm, to improve the reliability of the organic light emitting element 100, the color shift may be significantly caused depending on a viewing angle of the light emitted from the organic light emitting display device 1000. In contrast, when the capping layer 110 is removed to remove the color shift depending on a viewing angle, which is generated by the capping layer 110, the optical multilayer film 120 may be undesirably separated from the organic light emitting element 100 at the time of evaluating the reliability of the organic light emitting display device 1000.

Generally, after completing a product, reliability evaluation is performed to evaluate reliability of the product. The reliability evaluation is evaluation to check deformation of an appearance of the product when the product is left in a chamber in high temperature/high humidity environment, for example, 50° C./90% or 60° C./80% for several hours or several tens of hours or a problem of a screen at the time of driving. By performing the reliability evaluation, products which withstand the high temperature/high humidity environment may be shipped. The temperature or humidity for reliability evaluation is an exemplary embodiment, but does not limit the contents of the present disclosure.

That is, when the reliability of the organic light emitting display device 1000 which does not have the capping layer 110 is evaluated, since an expansion coefficient of the organic light emitting layer 102 which is formed of an organic material is different from an expansion coefficient of the optical multilayer film 120 which is formed of an inorganic material in the high temperature/high humidity environment, a gap is formed between the organic light emitting element 100 including the organic light emitting layer 102 and the optical multilayer film 120 so that the organic light emitting element 100 and the optical multilayer film 120 are separated from each other. Therefore, the capping layer 110 is disposed between the organic light emitting element 100 and the optical multilayer film 120 so that the optical multilayer film 120 is adhered to the organic light emitting element 100. In this case, the capping layer 110 is a functional layer which is formed to be thin so as to hardly apply an optical effect. A thickness of the capping layer 110 may be less than 5 nm. The capping layer 110 may be an insulating layer which is formed of an organic material or an inorganic material. Therefore, the capping layer 110 may suppress the optical multilayer film 120 from being separated from the organic light emitting element 100.

The optical multilayer film 120 which is adhered to the organic light emitting element 100 by the capping layer 110 includes a plurality of optical layers. A first optical layer 121, a second optical layer 122, a third optical layer 123, and a fourth optical layer 124 may be sequentially disposed.

An arrow of FIG. 1 represents a route of the light which is emitted to the front side from the organic light emitting layer 102 and represents primary interference 131 which is optical interference generated in the organic light emitting element 100 due to reflection of the light generated at an interface of the organic light emitting layer 102 and the anode 101 and the cathode 103 in the organic light emitting element 100 and secondary interference 132 due to the reflection of the light generated at an interface of optical layers having different refractive indexes in the optical multilayer film 120.

The first optical layer 121 may be formed to have a refractive index which is larger than a refractive index of the cathode 103. The light emitted through the cathode 103 is reflected (132A) at the interface of the first optical layer 121 having a refractive index which is larger than that of the cathode 103 and the cathode 103. Secondary interference of the light 132A which is reflected at the interface of the first optical layer 121 and the cathode 103 is generated in the optical multilayer film 120. In this case, an optical influence which is applied to the light emitted through the cathode 103 by the capping layer 110 disposed between the first optical layer 121 and the cathode 103 may be so small to be ignored.

When light having an incident angle of zero (vertical to an incident surface) is incident from a material having a small refractive index to a material having a large refractive index, reflected light is generated at an interface between the material having a small refractive index and the material having a large refractive index. An amount of the reflected light generated in this case is larger than an amount of reflected light generated when light having an incident angle of zero is incident from a material having a large refractive index to a material having a small refractive index. Therefore, the light is caused to be incident from a material having a small refractive index to a material having a large refractive index, so that the amount of the reflected light is increased and the secondary interference by the reflected light is efficiently generated.

Next, the second optical layer 122 is disposed on the first optical layer 121. The second optical layer 122 may be formed to have a refractive index which is smaller than that of the first optical layer 121.

Further, the third optical layer 123 is disposed on the second optical layer 122. The third optical layer 123 may be formed to have a refractive index which is larger than that of the second optical layer 122. Therefore, the light emitted through the second optical layer 122 is reflected (132B) at the interface of the third optical layer 123 having a refractive index which is larger than that of the second optical layer 122 and the second optical layer 122. Secondary interference of the light 132B which is reflected at the interface of the third optical layer 123 and the second optical layer 122 is generated in the optical multilayer film 120.

Therefore, the secondary interference of the light which is reflected at the interface of the cathode 103 and the first optical layer 121 and the interface of the second optical layer 122 and the third optical layer 123 is generated in the optical multilayer film 120 so that the organic light emitting display device 1000 according to the first exemplary embodiment generates weak microcavity effect as compared with a case when no optical multilayer film 120 is disposed or a single layer is disposed. Therefore, the color shift depending on a viewing angle is reduced by increasing a full width at half maximum of a main peak wavelength of red, green, and blue and thus the efficiency of the organic light emitting device is improved. Here, the weak microcavity refers to a state when the FWHM of the main peak wavelength is increased to less affect the property of the viewing angle.

Next, the fourth optical layer 124 may be disposed on the third optical layer 123. The fourth optical layer 124 may be formed to have a refractive index which is smaller than that of the third optical layer 123 and the light which passes through the third optical layer 123 is emitted through the fourth optical layer 124. In this case, the fourth optical layer 124 may be formed to have a thickness between 100 nm and 5000 nm, to improve the reliability of the organic light emitting element 100. Further, when no passivation layer is disposed on the fourth optical layer 124, the thickness of the fourth optical layer 124 may be formed to be thicker than the fourth optical layer 124 on which the passivation layer is disposed. However, the present disclosure is not limited thereto.

In this case, when the difference of refractive indexes of the first optical layer 121 and the second optical layer 122, the difference of refractive indexes of the second optical layer 122 and the third optical layer 123, and the difference of refractive indexes of the third optical layer 123 and the fourth optical layer 124 are large, a separation may be generated between the optical layers during the reliability evaluation due to the difference of expansion coefficients between optical layers having a large difference in refractive indexes during the reliability evaluation. Therefore, the optical layers may be formed to have the difference in refractive indexes of less than 0.6 at least 0.01.

The optical multilayer film which is formed of the above-described first to fourth optical layers 121, 122, 123, and 124 has one more optical layer than the optical multilayer film which is formed of first to third optical layers 121, 122, and 123 so that the color shift depending on a viewing angle of the organic light emitting display device 1000 may be reduced. However, when several optical layers are added, even though the color shift depending on a viewing angle is reduced, there may be another problem in that another characteristic of the organic light emitting display device 1000, for example, front efficiency or brightness is lowered. Therefore, it is important to optimize the number of optical layers to achieve the effect of the present disclosure without causing the problems related with the efficiency, the brightness, or the like.

That is, the optical multilayer film 120 which is formed of three or four optical layers may be effective due to the following reasons. When a white screen is displayed on the organic light emitting display device 1000, the white screen does not have yellow color and the separation of the optical multilayer film due to the difference of refractive indexes is suppressed during the reliability evaluation. Further, as the number of optical layers is increased, a possibility of haze of the optical multilayer film is increased, which may affect the brightness of the display device. The smaller the number of optical layers, the lower the possibility of haze. Further, the smaller the number of optical layers, the shorter the time to clean an optical layer deposition chamber. Therefore, the processing time may be shortened.

Therefore, according to the present disclosure, the minimum number of optical layers is used, so that the amount of light reflected due to the difference in refractive indexes of the optical layers is generated at maximum, so that the light which passes through the organic light emitting element 100 causes the secondary interference.

The optical multilayer film 120 may be formed of any one or more of silicon nitride SiNx, silicon oxide SiOx, and silicon oxynitride SiON. Among these, refractive indexes of silicon oxide SiOx and silicon oxynitride SiON are approximately between 1.46 and 1.5 at a wavelength of 400 nm to 700 nm and a refractive index of silicon nitride SiNx is approximately between 1.9 and 2.3. Therefore, the refractive indexes of silicon oxide SiOx and silicon oxynitride SiON are smaller than that of silicon nitride SiNx. Further, oxygen atom included in silicon oxide SiOx and silicon oxynitride SiON is coupled to hydrogen $H_2$ which is generated when an optical layer is formed so that hydrogen $H_2$ is suppressed from permeating into the organic light emitting element 100 to deteriorate the organic light emitting element 100.

Therefore, the optical layers having small refractive indexes among the optical layers which configure the optical multilayer film 120 are formed of silicon oxide SiOx or silicon oxynitride SiON, to suppress hydrogen $H_2$ from being generated when the optical layer is formed, thereby suppressing the deterioration of the organic light emitting layer. For example, the second optical layer 122 which is adjacent to the first optical layer 121 and has a small refractive index and the fourth optical layer 124 which is adjacent to the third optical layer 123 and has a small refractive index may be formed of silicon oxide SiOx or silicon oxynitride SiON.

Figure 2:
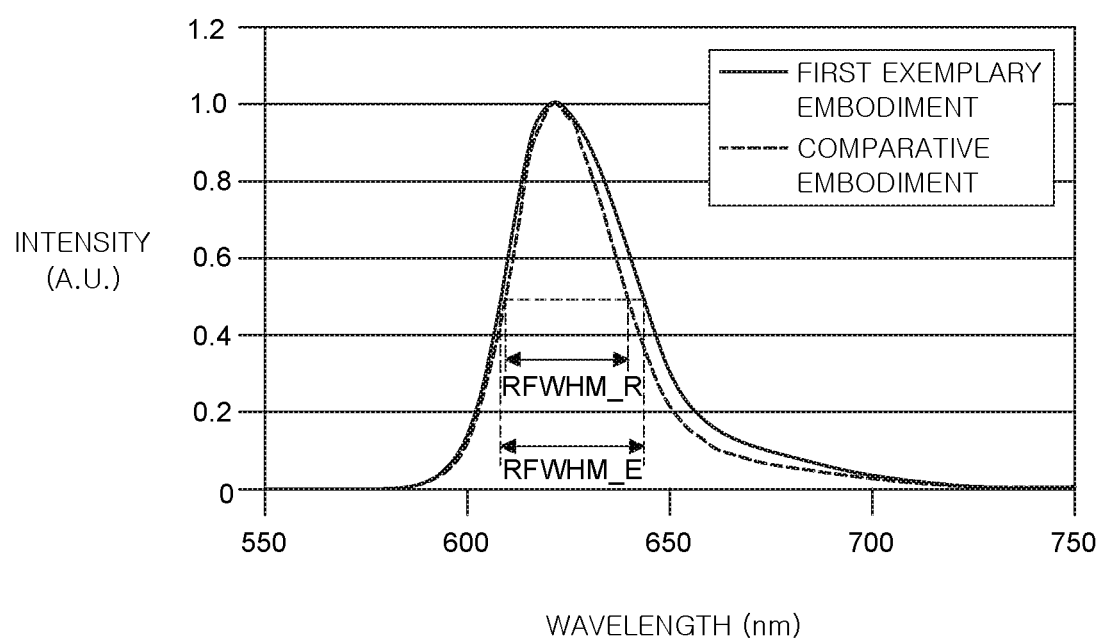
FIG. 2 is a graph illustrating a full width at half maximum of a main peak wavelength of red light according to a first exemplary embodiment and a comparative embodiment of the present disclosure.

FIG. 2 is a graph illustrating a full width at half maximum (FWHM) of a main peak wavelength of red light according to a first exemplary embodiment and a comparative embodiment of the present disclosure. A horizontal axis of the graph represents a wavelength and a vertical axis represents an intensity of the light. A unit of the horizontal axis is nm and A.U. (arbitrary unit) which is a unit of the vertical axis is a value obtained by normalizing an intensity of light by 1. In this case, the FWHM is a numerical value representing a width of a wavelength when an intensity of light becomes half. As the FWHM is increased, a light emitting spectrum becomes broader, so that the color shift depending on a viewing angle may be suppressed.

Figure 3:
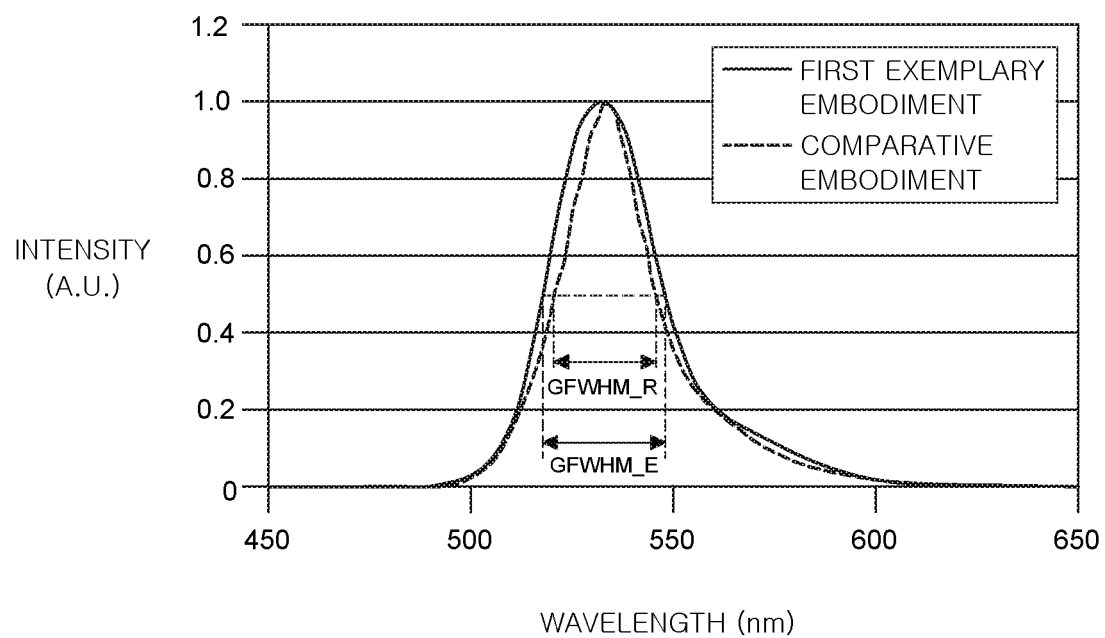
FIG. 3 is a graph illustrating a full width at half maximum of a main peak wavelength of green light according to a first exemplary embodiment and a comparative embodiment of the present disclosure.
Figure 4:
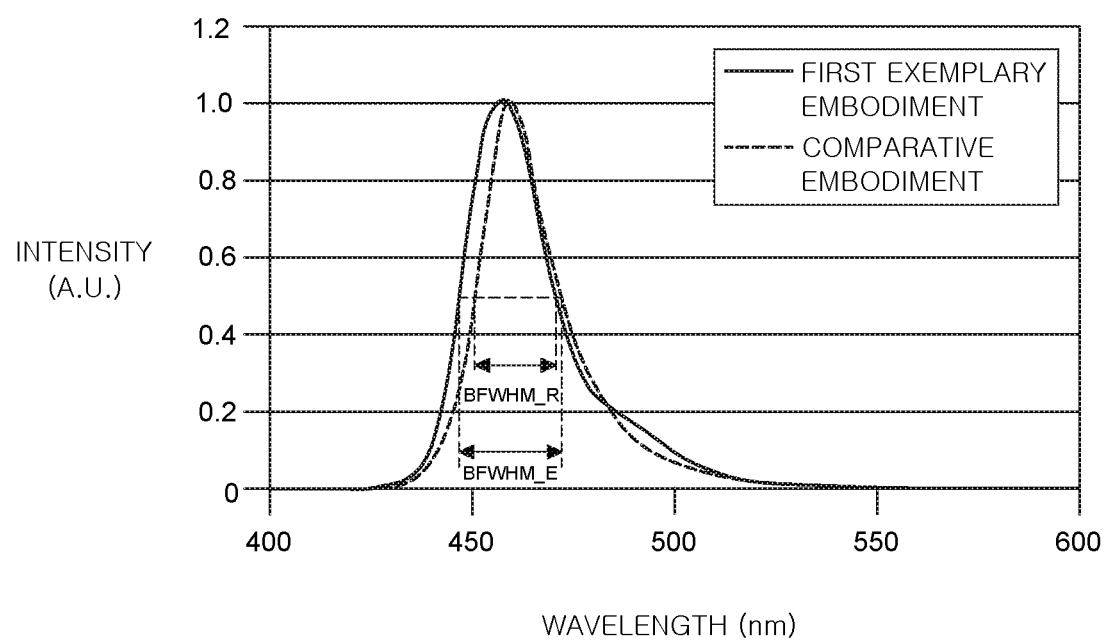
FIG. 4 is a graph illustrating a full width at half maximum of a main peak wavelength of blue light according to a first exemplary embodiment and a comparative embodiment of the present disclosure.

Conditions of a layer which is disposed on the organic light emitting element according to the first exemplary embodiment and the comparative embodiment of FIGS. 2 to 4 are represented in the following Table 1.

Referring to FIGS. 2 to 4, the full width at half maximum of a main peak wavelength of each of the red light, the green light, and the blue light emitted from the organic light emitting display element according to the first exemplary embodiment in which the optical multilayer film including a plurality of optical layers is disposed is larger than the full width at half maximum of a main peak wavelength of each of the red light, the green light, and the blue light emitted from the organic light emitting display element according to the comparative embodiment in which the single layer is disposed on the organic light emitting element. That is, the reflected light generated at the interface of the optical layer having a small refractive index and the optical layer having a large refractive index causes interference in the optical multilayer film, to generate the weak microcavity effect. Therefore, the full width at half maximum of a main peak wavelength may be increased as compared with a structure in which the optical multilayer film is not used. Therefore, the color shift depending on a viewing angle is reduced and the efficiency of the organic light emitting element may be improved.

TABLE 1

|  |  | Capping layer | Optical multilayer film |  |  |  | Organic layer | Passivation layer |
| --- | --- | --- | --- | --- | --- | --- | --- | --- |
| Comp. Ex. | Is provided? | ○ | SiNx |  |  |  | ○ | ○ |
|  | Thickness | 40 nm | 1.5 μm |  |  |  | 18 μm | 1.5 μm |
| First Ex. | Is provided? | ○ | SiNx | SiNx | SiNx | SiNx | X | X |
|  | Thickness | 5 nm | 500 nm | 200 nm | 300 nm | 900 nm | — | — |

According to the comparative embodiment, in the organic light emitting display device formed as represented in Table 1, the optical multilayer film is formed of one inorganic insulating layer. According to the first exemplary embodiment, the optical multilayer film includes four optical layers having different thicknesses and four organic layers are alternatively disposed in the order of an optical layer having a high refractive index and an organic layer having a low refractive index. In the first exemplary embodiment in which the organic layer and the passivation layer are not provided, a last optical layer is formed to be thick in order to secure the reliability of the organic light emitting element. The capping layer, the optical multilayer film, the organic layer, and the passivation layer represented in Table 1 are deposited on the organic light emitting element in this order.

Referring to FIG. 2, a full width at half maximum of a main peak wavelength (RFWHM_E) of the red light according to the first exemplary embodiment of the present disclosure is 35.2 nm, which is 4.9 nm broader than a full width at half maximum of a main peak wavelength (RFWHM_R) of the red light according to the comparative embodiment which is 30.3 nm.

Referring to FIG. 3, a full width at half maximum of a main peak wavelength (GFWHM_E) of the green light according to the first exemplary embodiment of the present disclosure is 30.7 nm, which is 5.4 nm broader than a full width at half maximum of a main peak wavelength (GFWHM_R) of the green light according to the comparative embodiment which is 25.3 nm.

Referring to FIG. 4, a full width at half maximum of a main peak wavelength (BFWHM_E) of the blue light according to the first exemplary embodiment of the present disclosure is 23.6 nm, which is 2.6 nm broader than a full width at half maximum of a main peak wavelength (BFWHM_R) of the blue light according to the comparative embodiment which is 21 nm.

FIGS. 5A to 5D are graphs illustrating a color coordinate shift amount of white light depending on a viewing angle in right, upper, left, and lower directions from a center of the organic light emitting display device as comparative embodiments and FIGS. 6A to 6D are graphs illustrating a color coordinate shift amount of white light depending on a viewing angle in right, upper, left, and lower directions from a center of the organic light emitting display device as a first exemplary embodiment. In this case, the right, upper, left, and lower directions of the organic light emitting display device may be represented by azimuth angles of 0°, 90°, 180°, and 270°. The color coordinate shift amount (Δu'v') refers to a difference of a color coordinate as seen at the front and a color coordinate at a viewing angle and the color coordinate (u'v') refers to 1976 UCS color space defined in International Commission on Illumination CIE 15.2. The viewing angle measured in FIGS. 5A to 5D are 0° to 60° and a viewing angle at a start position X is 0°.

The graphs of FIGS. 5A to 5D are results obtained by applying a structure of the comparative embodiment listed in Table 1.

Figure 5A:
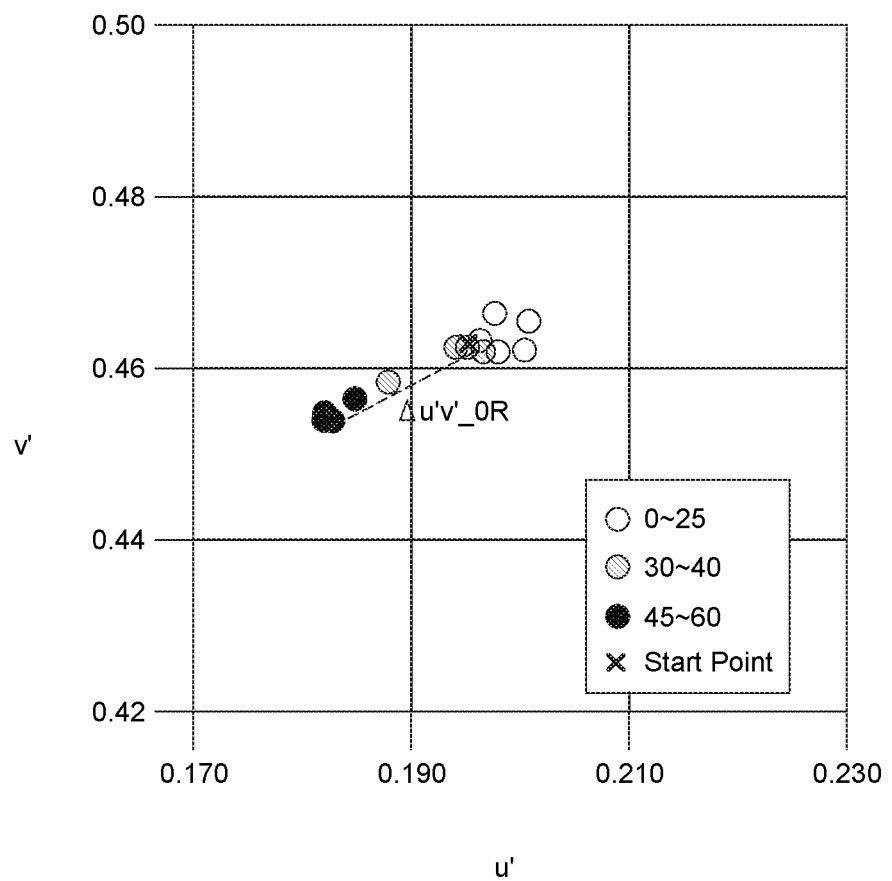
FIGS. 5A to 5D are graphs illustrating a color coordinate shift amount of white light depending on a viewing angle in right, upper, left, and lower directions from a center of the organic light emitting display device as a comparative embodiment.

Referring to FIG. 5A, in a graph obtained by forming a viewing angle to the right direction (azimuth angle is 0°) in a state when the front is seen at the center of the organic light emitting display device to measure the color coordinate of the white light, the maximum color coordinate shift amount (Δu'v'_0R) is approximately 0.016.

Figure 5B:
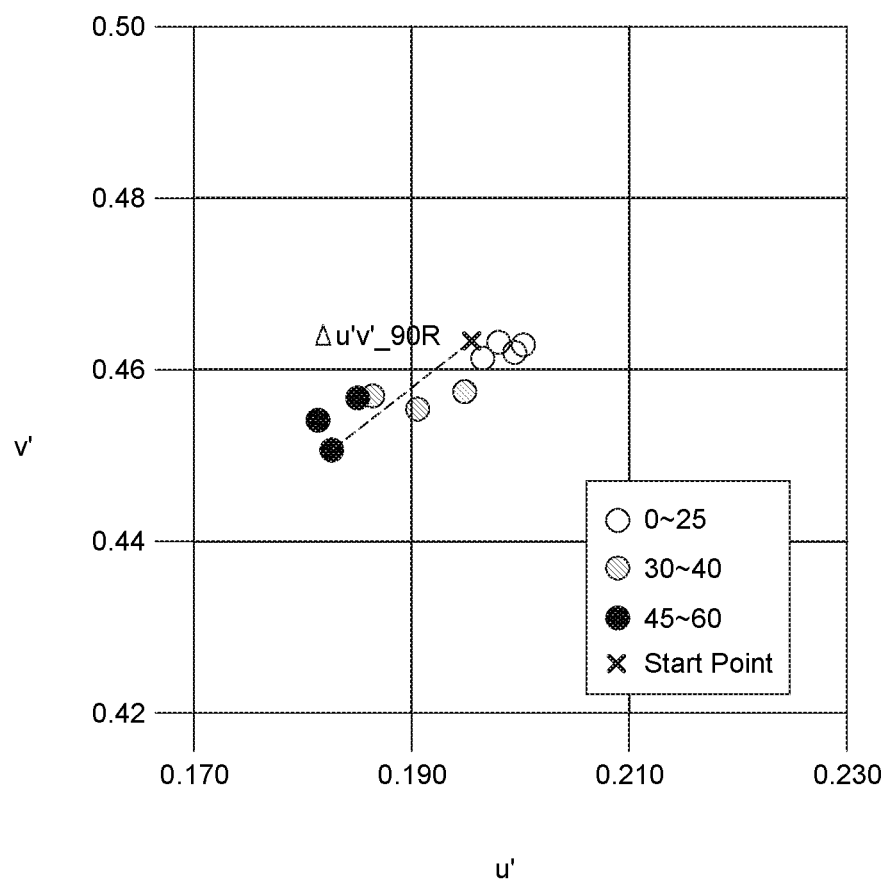

Referring to FIG. 5B, in a graph obtained by forming a viewing angle to the upper direction (azimuth angle is 90°) in a state when the front is seen at the center of the organic light emitting display device to measure the color coordinate of the white light, the maximum color coordinate shift amount (Δu'v'_90R) is approximately 0.018.

Figure 5C:
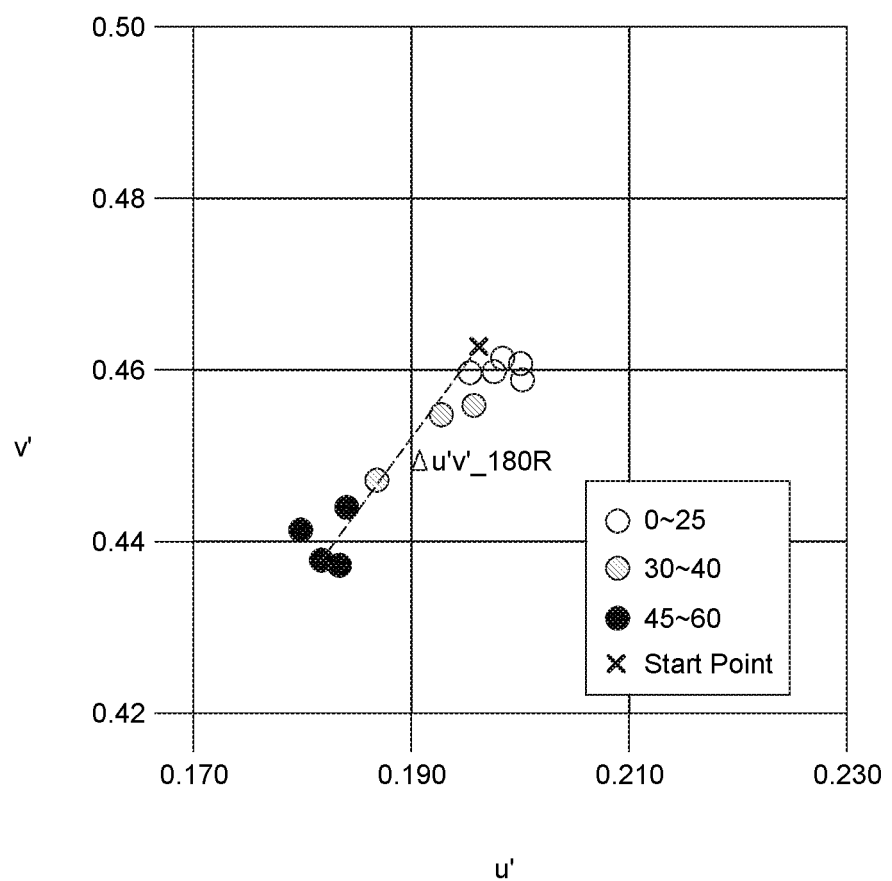

Referring to FIG. 5C, in a graph obtained by forming a viewing angle to the left direction (azimuth angle is 180°) in a state when the front is seen at the center of the organic light emitting display device to measure the color coordinate of the white light, the maximum color coordinate shift amount (Δu'v'_180R) is approximately 0.029.

Figure 5D:
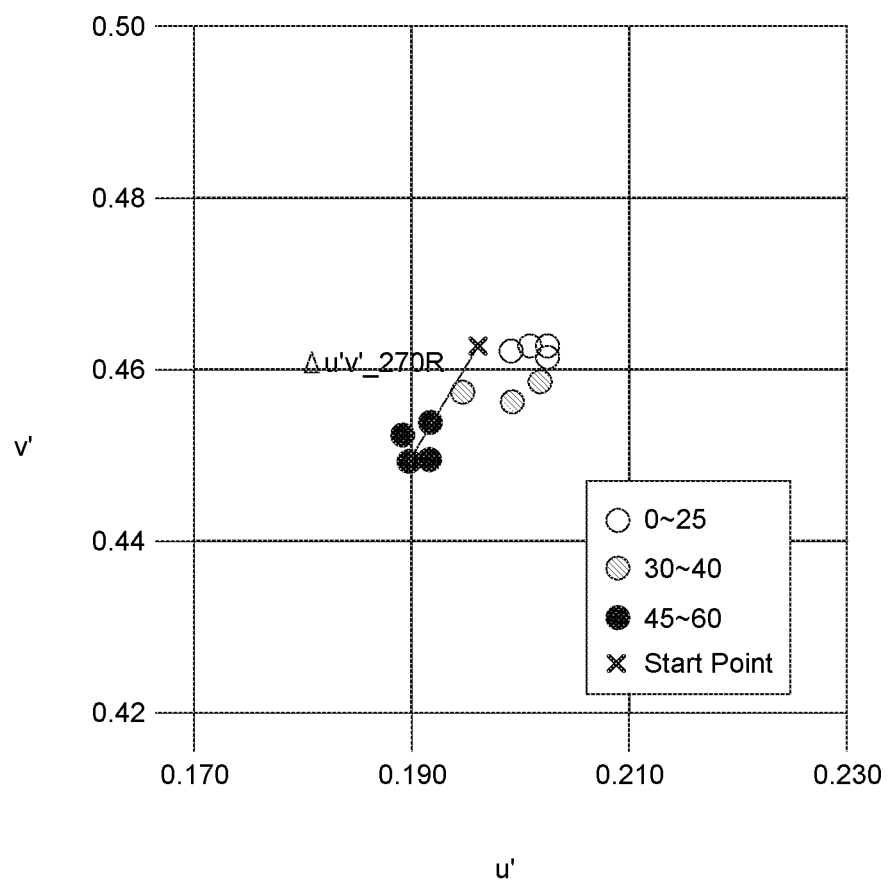

Referring to FIG. 5D, in a graph obtained by forming a viewing angle to the lower direction (azimuth angle is 270°) in a state when the front is seen at the center of the organic light emitting display device to measure the color coordinate of the white light, the maximum color coordinate shift amount (Δu'v'_270R) is approximately 0.015.

The graphs of FIGS. 6A to 6D are results obtained by applying a structure of the first exemplary embodiment listed in Table 1.

Figure 6A:
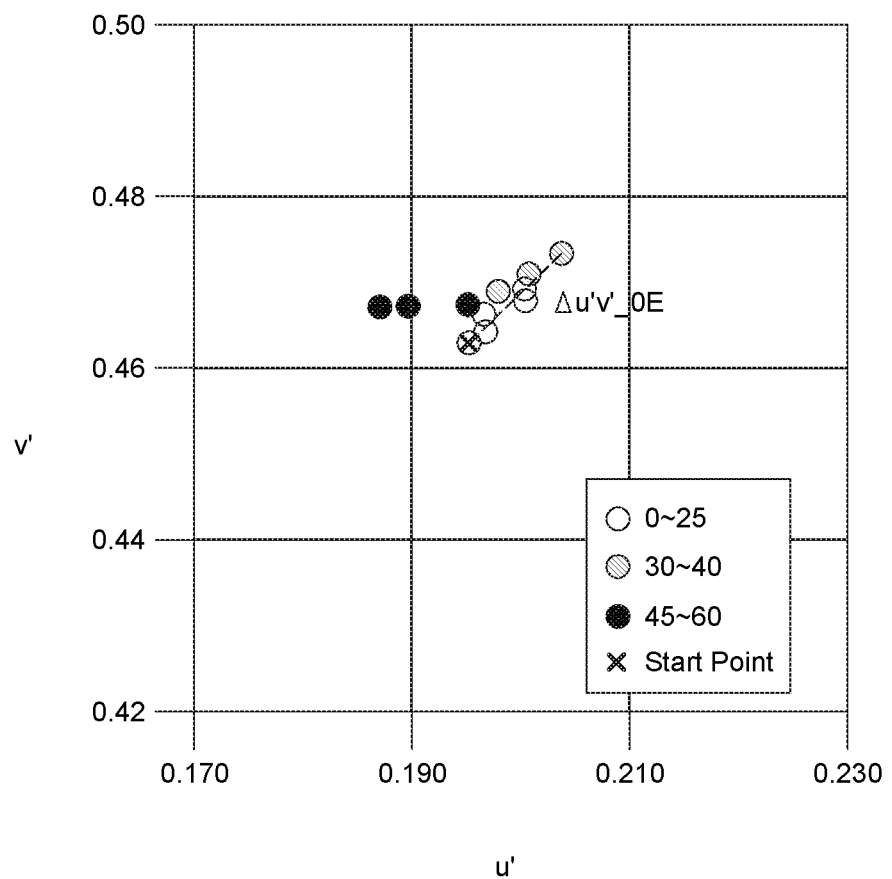
FIGS. 6A to 6D are graphs illustrating a color coordinate shift amount of white light depending on a viewing angle in right, upper, left, and lower directions from a center of the organic light emitting display device as a first exemplary embodiment.

Referring to FIG. 6A, in a graph obtained by forming a viewing angle to the right direction (azimuth angle is 0°) in a state when the front is seen at the center of the organic light emitting display device to measure the color coordinate of the white light, the maximum color coordinate shift amount (Δu'v'_0E) is approximately 0.013.

Figure 6B:
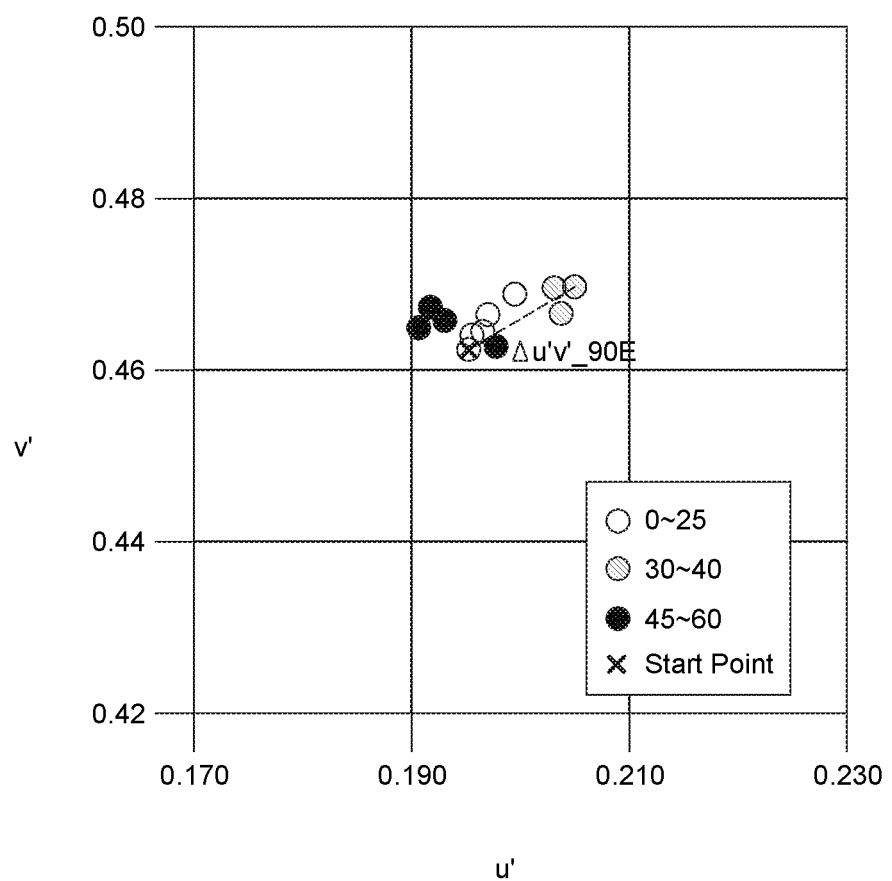

Referring to FIG. 6B, in a graph obtained by forming a viewing angle to the upper direction (azimuth angle is 90°) in a state when the front is seen at the center of the organic light emitting display device to measure the color coordinate of the white light, the maximum color coordinate shift amount (Δu'v'_90E) is approximately 0.012.

Figure 6C:
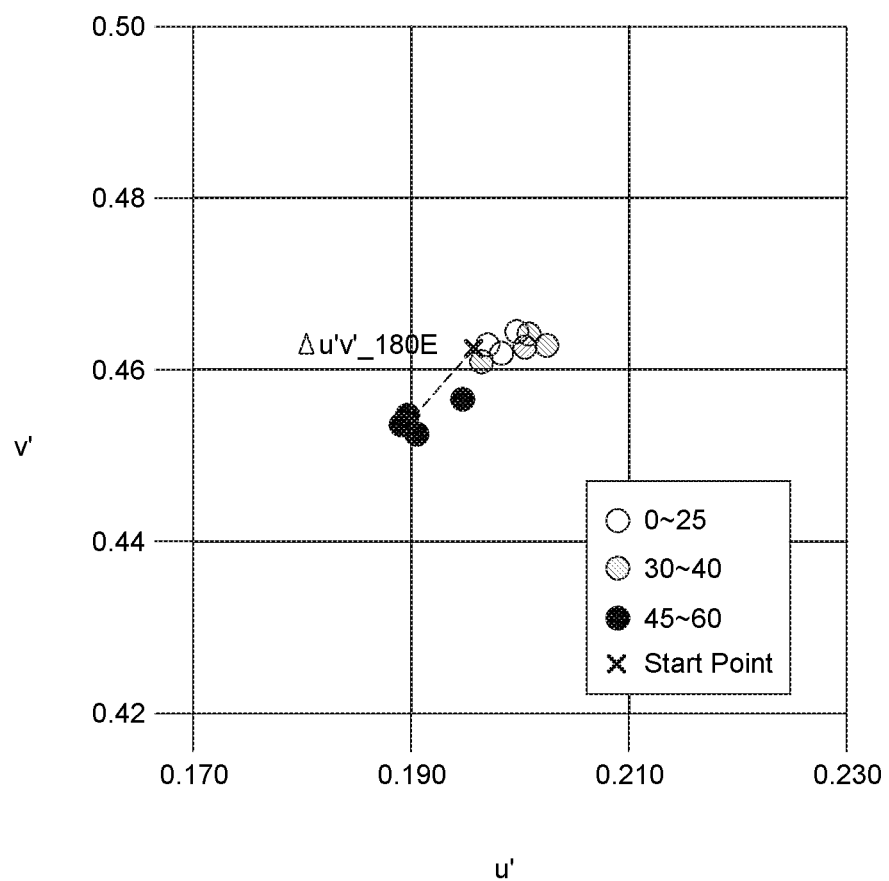

Referring to FIG. 6C, in a graph obtained by forming a viewing angle to the left direction (azimuth angle is 180°) in a state when the front is seen at the center of the organic light emitting display device to measure the color coordinate of the white light, the maximum color coordinate shift amount (Δu'v'_180E) is approximately 0.012.

Figure 6D:
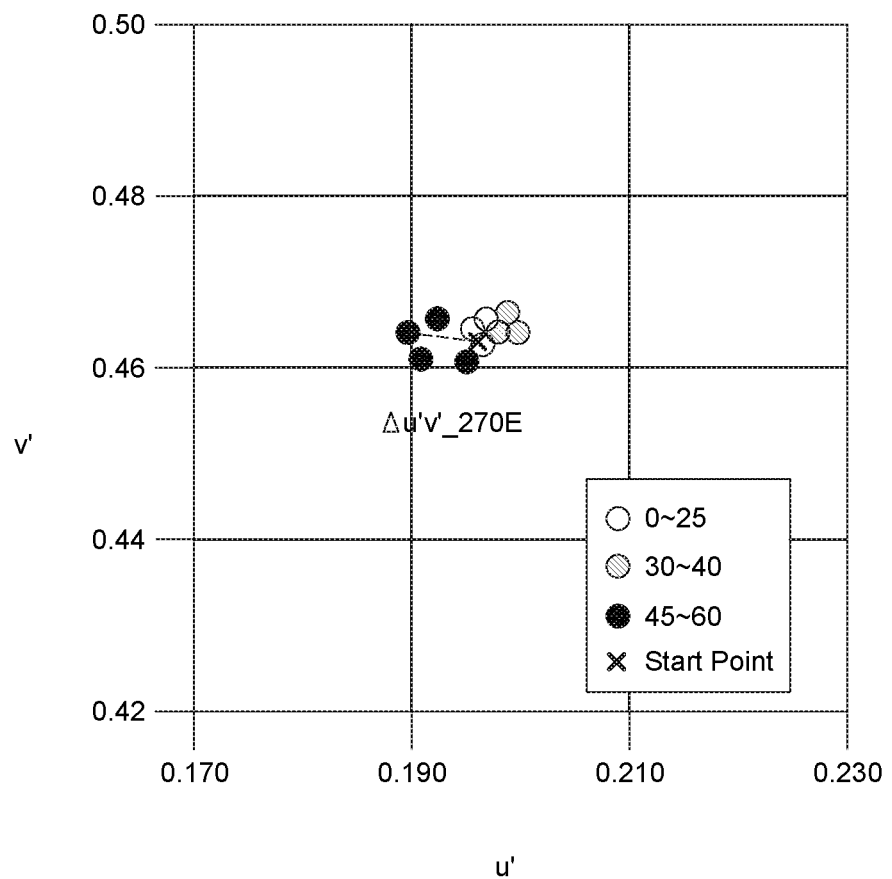

Referring to FIG. 6D, in a graph obtained by forming a viewing angle to the lower direction (azimuth angle is 270°) in a state when the front is seen at the center of the organic light emitting display device to measure the color coordinate of the white light, the maximum color coordinate shift amount (Δu'v'_270E) is approximately 0.006.

When the maximum color coordinate shift amounts of the comparative embodiment and the first exemplary embodiment are compared according to the direction of forming a viewing angle, it is confirmed that the maximum color coordinate shift amount of the first exemplary embodiment is smaller than that of the comparative embodiment. That is, the maximum color coordinate shift amount of the white light emitted from the organic light emitting display device according to the comparative embodiment in which the optical multilayer film is formed by a single layer is larger than the maximum color coordinate shift amount of the white light emitted from the organic light emitting display device according to the first exemplary embodiment in which the optical multilayer film including a plurality of optical layers having a high refractive index and optical layers having a low refractive index. Therefore, when the first exemplary embodiment is applied, the color shift depending on a viewing angle is reduced and the efficiency of the organic light emitting element is improved.

Figure 7:
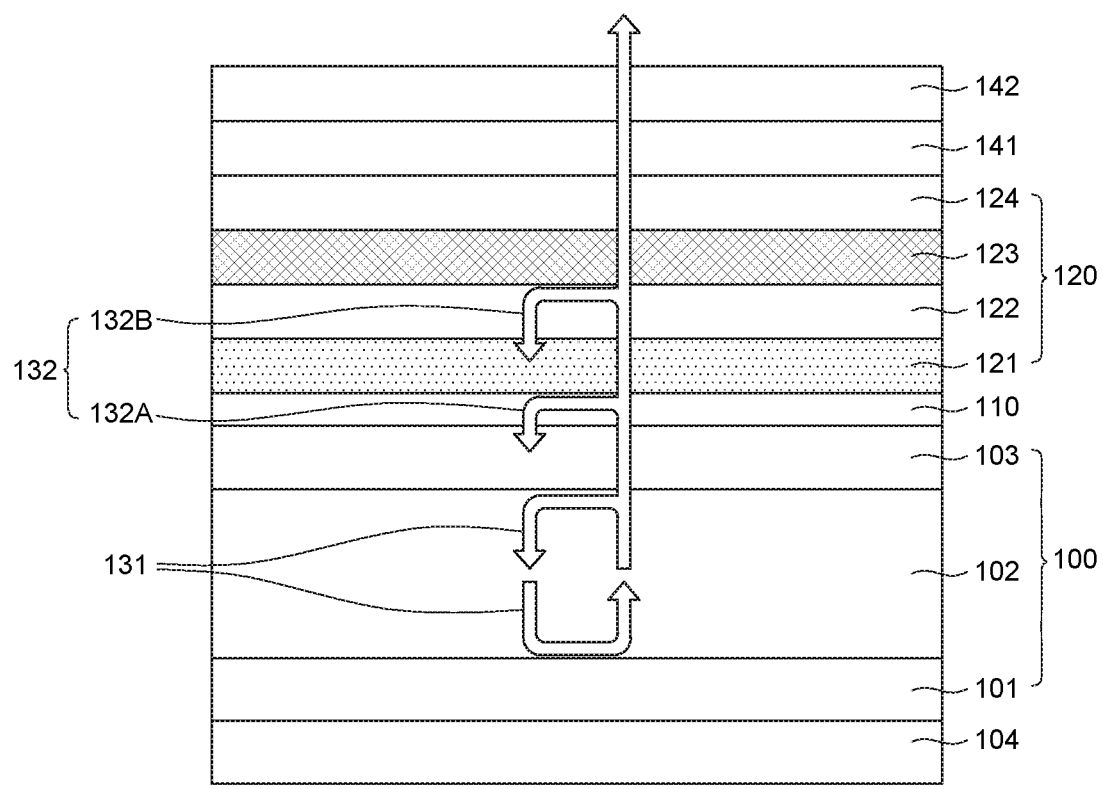
FIG. 7 is a cross-sectional view illustrating an organic light emitting display device according to a second exemplary embodiment of the present disclosure.

FIG. 7 is a cross-sectional view illustrating an organic light emitting display device according to a second exemplary embodiment of the present disclosure. The organic light emitting display device according to the second exemplary embodiment may include the same components as those of the first exemplary embodiment described above and redundant description with the first exemplary embodiment will be omitted.

FIG. 7 illustrates a structure in which an organic layer 141 and a passivation layer 142 are added to the structure of the first exemplary embodiment. The passivation layer 142 which protects the organic light emitting element 100 is added to the structure of the first exemplary embodiment, so that the thickness of the fourth optical layer 124 may be smaller than the thickness applied in the first exemplary embodiment and the fourth optical layer 124 may be omitted.

The passivation layer 142 is disposed on the optical multilayer film 120 to suppress moisture and oxygen from permeating into the organic light emitting element 100 and improve the reliability of the organic light emitting element 100. The passivation layer 142 is an inorganic insulating layer and is formed of any one or more of silicon nitride SiNx, silicon oxide SiOx, and silicon oxynitride SiON, but is not limited thereto. A thickness of the passivation layer 142 may be between 0.05 μm and 1.5 μm, but is not limited thereto.

The organic layer 141 is an organic insulating layer which may be disposed between the optical multilayer film 120 and the passivation layer 142 and may be formed of polymer. The organic layer 141 is also referred to as a particle covering layer (PCL) and severs to cover particles which are formed during the process. For example, when the passivation layer 142 which is formed of an inorganic insulating material is disposed on the optical multilayer film 120 with particles attached on the surface thereof, without having the organic layer 141, the inorganic insulating material does not have strong adhesion with the particles attached on the surface of the optical multilayer film 120, so that there may be gaps around the particles. Therefore, the passivation layer 142 may be separated therefrom due to the formation of the gap. Therefore, the organic layer 141 which is formed of an organic material is disposed between the optical multilayer film 120 and the passivation layer 142 to cover the particles and the surroundings of the particles to suppress the passivation layer 142 from being separated. In this case, the thickness of the organic layer 141 may be between 5 μm and 20 μm, but is not limited thereto.

Figure 8:
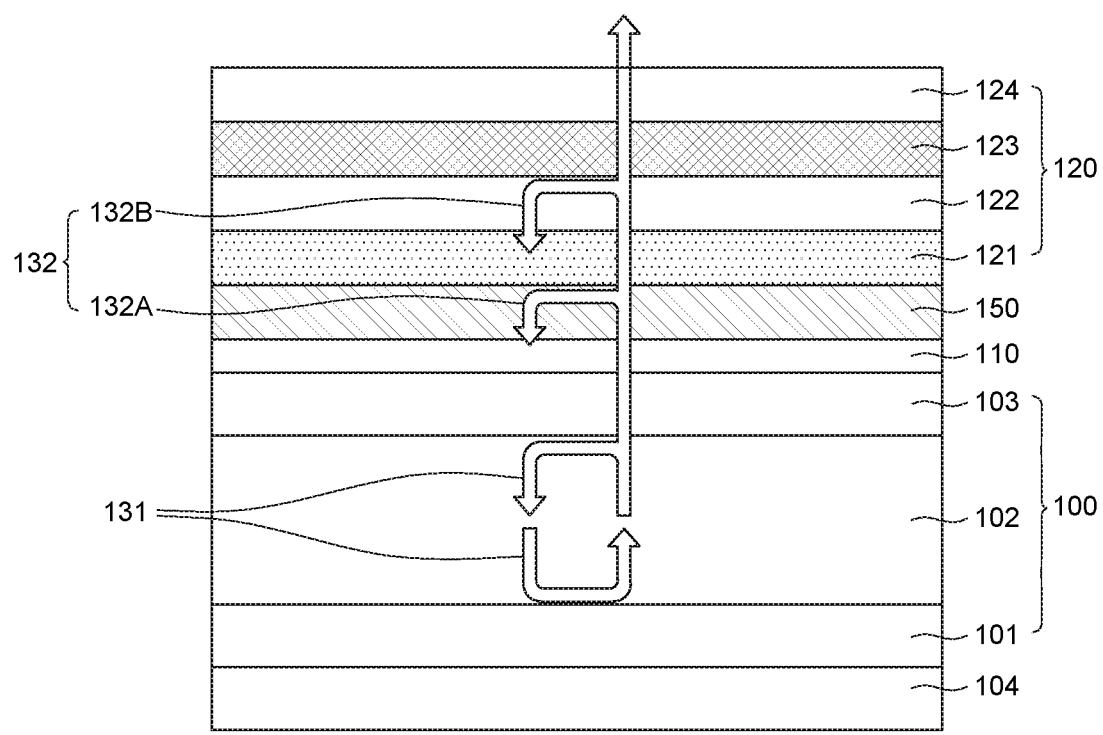
FIG. 8 is a cross-sectional view illustrating an organic light emitting display device according to a third exemplary embodiment of the present disclosure.

FIG. 8 is a cross-sectional view illustrating an organic light emitting display device according to a third exemplary embodiment of the present disclosure. The organic light emitting display device according to the third exemplary embodiment may include the same components as those of the first exemplary embodiment described above and redundant description with the first exemplary embodiment will be omitted.

FIG. 8 illustrates a structure in which an atomic deposition layer 150 is added to the structure of the first exemplary embodiment. The atomic deposition layer 150 is disposed between the capping layer 110 and the optical multilayer film 120 and may be formed of any one or more of silicon oxide SiOx and aluminum oxide $Al_2O_3$, but is not limited thereto.

The atomic deposition layer 150 is a layer formed using an atomic layer deposition (ALD) technique. The atomic deposition layer is formed by accumulating atomic layers so that very thin film may be formed and a thickness and a composition of the film may be precisely controlled. Therefore, the film may be uniformly formed even on a large size substrate and a stack coverage ability is excellent so that a surface of the capping layer 110 is covered by the atomic deposition layer 150, to improve the reliability of the organic light emitting element 100.

Figure 9:
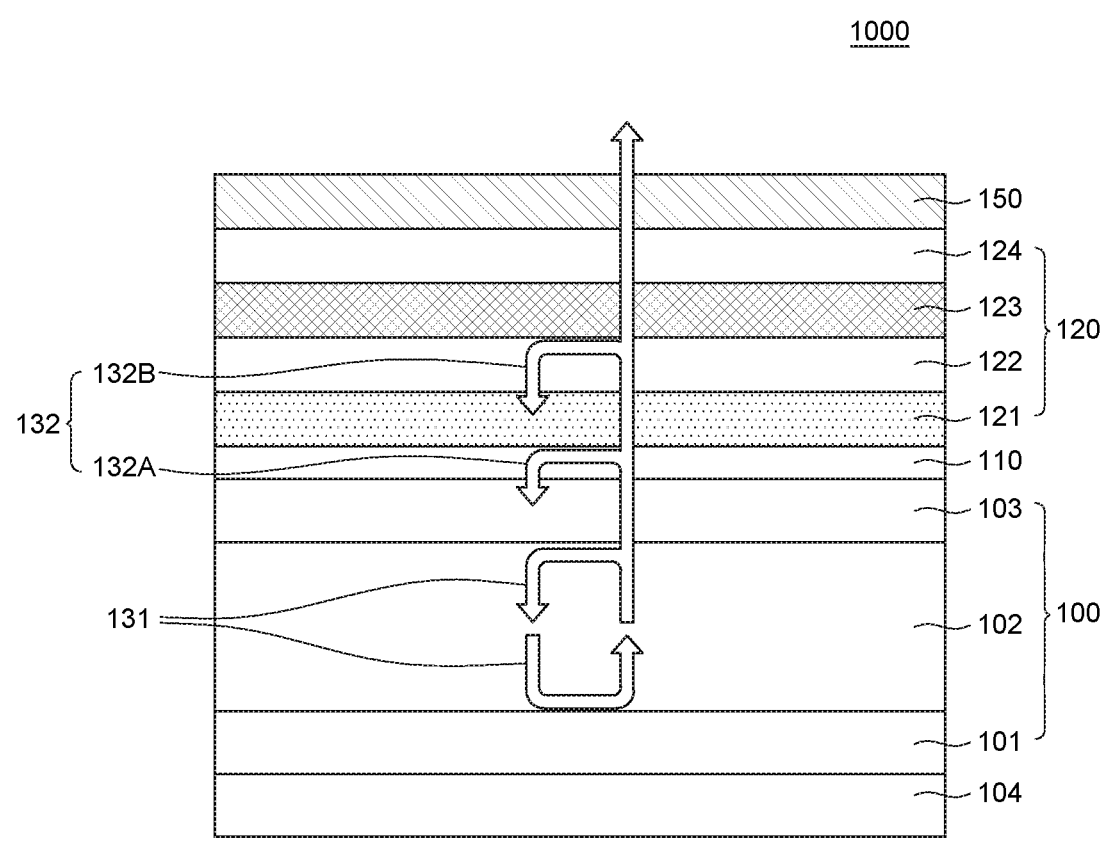
FIG. 9 is a cross-sectional view illustrating an organic light emitting display device according to a fourth exemplary embodiment of the present disclosure.

FIG. 9 is a cross-sectional view illustrating an organic light emitting display device according to a fourth exemplary embodiment of the present disclosure. The organic light emitting display device according to the fourth exemplary embodiment may include the same components as those of the first and third exemplary embodiments described above and redundant description with the first and third exemplary embodiments will be omitted.

FIG. 9 illustrates a structure in which the atomic deposition layer 150 described with reference to FIG. 8 is disposed on the optical multilayer film 120. As illustrated in FIG. 9, the atomic deposition layer 150 is located at the top of the organic light emitting display device 1000 to closely seal not only the organic light emitting element 100 but also the optical multilayer film 120 using the excellent stack coverage ability, to improve the reliability of the organic light emitting display device 1000.

In FIG. 8 or 9, the atomic deposition layer 150 is formed to be in contact with the optical multilayer film 120 to secure the reliability of the organic light emitting display device 1000. The passivation layer is further disposed on the optical multilayer film 120 or the atomic deposition layer 150 to further improve the reliability of the organic light emitting display device 1000.

The exemplary embodiments of the present disclosure can also be described as follows:

According to an aspect of the present disclosure, an organic light emitting display device includes an organic light emitting element including a cathode, an anode, and an organic light emitting layer; and an optical multilayer film on the organic light emitting element. Herein, the optical multilayer film is constructed such that a full width at half maximum of light emitted from the organic light emitting element is larger than a full width at half maximum of light emitted from a structure in which the optical multilayer film is not used, thereby reducing color shift depending on a viewing angle of the organic light emitting display device and improving efficiency of the organic light emitting element.

The organic light emitting display device may further include a passivation layer on the optical multilayer film.

The organic light emitting display device may further include an organic layer between the optical multilayer film and the passivation layer.

The optical multilayer film may include three optical layers having different refractive indexes.

The three optical layers may be formed such that a first optical layer, a second optical layer, and a third optical layer are sequentially deposited on the cathode and a refractive index of the second optical layer is smaller than those of the first optical layer and the third optical layer.

The optical multilayer film may include four optical layers and refractive indexes of odd-numbered deposited optical layers from the cathode may be larger than those of an even-numbered deposited optical layer.

A thickness of the last deposited optical layer among the four optical layers may be between 100 nm and 5000 nm.

The organic light emitting display device may further include an insulating layer on the organic light emitting element and a thickness of the insulating layer may be less than 5 nm.

The optical multilayer film may include a plurality of optical layers and an optical layer having a relatively small refractive index among the plurality of optical layers may be formed of silicon oxynitride (SiON).

The organic light emitting display device may further include an atomic deposition layer above or below the optical multilayer film.

According to another aspect of the present disclosure, an organic light emitting display device includes an organic light emitting element including a cathode, an anode, and an organic light emitting layer; and an optical multilayer film including a plurality of optical layers on the organic light emitting element. The optical multilayer film may be configured to cause a weak microcavity effect. Therefore, a full width at half maximum (FWHM) of a main peak wavelength of the light emitted from the organic light emitting element is larger than that of the case when the single optical layer is used, thereby reducing color shift depending on a viewing angle of the organic light emitting display device and improving efficiency of the organic light emitting element.

The optical multilayer film may include a pair of optical layers in which an optical layer having a relatively larger refractive index and an optical layer having a relatively smaller refractive index are sequentially disposed.

The optical multilayer film may further include another pair of optical layers in which an optical layer having a relatively larger refractive index and an optical layer having a relatively smaller refractive index are sequentially disposed.

A difference of the refractive indexes of the optical layer having a relatively larger refractive index and the optical layer having a relatively smaller refractive index may be between 0.01 and 0.6.

The organic light emitting display device may further include a functional layer on the organic light emitting layer and configured to reduce separation due to a difference of expansion coefficients of the optical multilayer film and the organic light emitting layer.

The organic light emitting display device may further include an atomic deposition layer which is contact with an upper portion or a lower portion of the optical multilayer film.

According to yet another aspect of the present disclosure, an organic light emitting display device includes: an organic light emitting element including a cathode and an optical multilayer film deposited a first optical layer and a second optical layer in order on the organic light emitting element. Herein, a refractive index of the first optical layer is larger than a refractive index of the second optical layer. Therefore, in addition to primary interference, secondary interference is generated in the optical multilayer film to reduce the color shift depending on a viewing angle and improve efficiency of the organic light emitting element.

The refractive index of the first optical layer may be larger than a refractive index of the cathode.

The optical multilayer film may further include a third optical layer and the refractive index of the second optical layer may be smaller than a refractive index of the third optical layer.

The optical multilayer film may further include a fourth optical layer and the refractive index of the third optical layer may be larger than a refractive index of the fourth optical layer.

It will be apparent to those skilled in the art that various modifications and variations can be made in the organic light emitting display device of the present disclosure without departing from the spirit or scope of the disclosure. Thus, it is intended that the present disclosure cover the modifications and variations of this disclosure provided they come within the scope of the appended claims and their equivalents.

What is claimed is:
1. An organic light emitting display device, comprising:
an organic light emitting element including a cathode, an anode, and an organic light emitting layer;
an optical multilayer film with a specific layer stacking order of at least three optical layers including a first optical layer on the cathode, a second optical layer on the first optical layer, and a third optical layer on the second optical layer;
an insulating layer between the organic light emitting element and the optical multilayer film such that a bottom surface of the insulating layer is in direct contact with an upper surface of the cathode, the insulating layer formed of an organic material; and
an atomic deposition layer between the insulating layer and the optical multilayer film such that an upper surface of the atomic deposition layer is in direct contact with a bottom surface of the first optical layer, the atomic deposition layer formed of one or more of silicon oxide $SiO_x$ and aluminum oxide $Al_2O_3$,
wherein a refractive index of the first optical layer is larger than that of the cathode, and a refractive index of the second optical layer is smaller than those of the first optical layer and the third optical layer,
wherein an upper surface of the insulating layer is in direct contact with a bottom surface of the atomic deposition layer, and wherein the at least three optical layers all have different thicknesses from each other.

2. The organic light emitting display device according to claim 1, further comprising:
a passivation layer in direct contact with the optical multilayer film.

3. The organic light emitting display device according to claim 1, further comprising:
a passivation layer on the optical multilayer film; and
an organic layer between the optical multilayer film and the passivation layer.

4. The organic light emitting display device according to claim 3, wherein a thickness of the passivation layer is between 0.05 μm and 1.5 μm, and a thickness of the organic layer is between 5 μm and 20 μm.

5. The organic light emitting display device according to claim 1, wherein:
the organic light emitting display device having the optical multilayer film with the specific layer stacking order exhibits reduced color shift characteristics depending on a viewing angle, when compared to an otherwise identical organic light emitting display device that lacks the optical multilayer film with the specific layer stacking order, and
the color shift characteristics include a spectral full width at half maximum of light emitted from the organic light emitting element being larger than a spectral full width at half maximum of light emitted from the otherwise identical organic light emitting display device.

6. The organic light emitting display device according to claim 1, wherein the optical multilayer film includes a fourth optical layer and a refractive index of the fourth optical layer is smaller than that of the third optical layer.

7. The organic light emitting display device according to claim 6, wherein a thickness of the topmost optical layer among the four optical layers is between 100 nm and 5000 nm.

8. The organic light emitting display device according to claim 1, wherein a thickness of the insulating layer is less than 5 nm so as to hardly apply an optical effect.

9. The organic light emitting display device according to claim 1, wherein the optical multilayer film includes a plurality of optical layers and an optical layer having a relatively small refractive index among the plurality of optical layers is formed of silicon oxynitride (SiON).

10. An organic light emitting display device, comprising:
an organic light emitting element including a cathode, an anode, and an organic light emitting layer;
an optical multilayer film including a first pair composed of a first and a second optical layers and a second pair composed of a third and a fourth optical layers, wherein the first pair and the second pair are sequentially stacked on the organic light emitting element;
an insulating layer between the organic light emitting element and the optical multilayer film such that a bottom surface of the insulating layer is in direct contact with an upper surface of the cathode, the insulating layer formed of an organic material;
an organic layer in direct contact with an upper surface of the fourth optical layer whose thickness is between 5 μm and 20 μm; and
an atomic deposition layer between the insulating layer and the optical multilayer film such that an upper surface of the atomic deposition layer is in direct contact with a bottom surface of the first optical layer, the atomic deposition layer formed of one or more of silicon oxide $SiO_x$ and aluminum oxide $Al_2O_3$,
wherein an upper surface of the insulating layer is in direct contact with a bottom surface of the atomic deposition layer, and
wherein two optical layers in each of the first pair and the second pair have different refractive indexes from each other, and a first optical layer having a relatively larger refractive index is located under a second optical layer having a relatively smaller refractive index.

11. The organic light emitting display device according to claim 10, wherein the first optical layer and the second optical layer are sequentially disposed, and the refractive index of the first optical layer is larger than a refractive index of the cathode.

12. The organic light emitting display device according to claim 11, wherein the optical multilayer film further includes another pair of optical layers in which a third optical layer having a relatively larger refractive index and a fourth optical layer having a relatively smaller refractive index are sequentially disposed, and a refractive index of the third optical layer is larger than a refractive index of the second optical layer.

13. The organic light emitting display device according to claim 10, wherein a difference of the refractive indexes of the pair of optical layers is between 0.01 and 0.6.

14. The organic light emitting display device according to claim 10, further comprising:
a functional layer on the organic light emitting layer and configured to reduce separation due to a difference of expansion coefficients of the optical multilayer film and the organic light emitting layer.

15. An organic light emitting display device, comprising:
an organic light emitting element including a cathode;
an optical multilayer film with a specific layer stacking order of at least three optical layers including a first optical layer on the cathode of the organic light emitting element, a second optical layer on the first optical layer, and a third optical layer on the second optical layer;
an insulating layer between the organic light emitting element and the optical multilayer film such that a bottom surface of the insulating layer is in direct contact with an upper surface of the cathode, the insulating layer formed of an organic material;
an organic layer on the optical multilayer film whose thickness is between 5 μm and 20 μm; and an atomic deposition layer between the insulating layer and the optical multilayer film such that a bottom surface of the atomic deposition layer is in direct contact with an upper surface of the insulating layer, the atomic deposition layer formed of one or more of silicon oxide $SiO_x$ and aluminum oxide $Al_2O_3$, wherein a refractive index of the first optical layer is larger than a refractive index of the second optical layer and the cathode, which provides a spectral full width at half maximum of light emitted from the organic light emitting element to be larger than a spectral full width at half maximum of light emitted from an otherwise identical organic light emitting display device in which the optical multilayer film is not present.

16. The organic light emitting display device according to claim 15, wherein the refractive index of the second optical layer is smaller than a refractive index of the third optical layer.

17. The organic light emitting display device according to claim 16, wherein the optical multilayer film further includes a fourth optical layer on the third optical layer and the refractive index of the third optical layer is larger than a refractive index of the fourth optical layer.

* * * * *